(12) United States Patent
Joardar et al.

(10) Patent No.: US 12,740,020 B2
(45) Date of Patent: Sep. 15, 2026

(54) SERVER WITH HYBRID THERMAL MANAGEMENT SYSTEM

(71) Applicant: Carrier Corporation, Palm Beach Gardens, FL (US)

(72) Inventors: Arindom Joardar, Jamesville, NY (US); Richard Lord, Monteagle, TN (US); Michel Grabon, Bressolles (FR); Tobias Sienel, Baldwinsville, NY (US); My Dinh Truong, Redwood City, CA (US); Tikhon Suresh Pichai, Simpsonville, SC (US)

(73) Assignees: CARRIER CORPORATION, Palm Beach Gardens, FL (US); EQUINIX INC., Redwood City, CA (US)

( * ) Notice: Subject to any disclaimer, the term of this patent is extended or adjusted under 35 U.S.C. 154(b) by 94 days.

(21) Appl. No.: 18/407,994

(22) Filed: Jan. 9, 2024

(65) Prior Publication Data

US 2024/0237308 A1 Jul. 11, 2024

Related U.S. Application Data

(60) Provisional application No. 63/586,527, filed on Sep. 29, 2023, provisional application No. 63/479,115, filed on Jan. 9, 2023.

(51) Int. Cl.
*H05K 7/20* (2006.01)

(52) U.S. Cl.
CPC ..... *H05K 7/20772* (2013.01); *H05K 7/20154* (2013.01); *H05K 7/20254* (2013.01); *H05K 7/20309* (2013.01); *H05K 7/20727* (2013.01); *H05K 7/20809* (2013.01); *H05K 7/20836* (2013.01)

(58) Field of Classification Search
CPC ........... H05K 7/20772; H05K 7/20254; H05K 7/20154; H05K 7/20727; H05K 7/20809; G06F 1/20
See application file for complete search history.

(56) References Cited

U.S. PATENT DOCUMENTS 5,216,580 A * 6/1993 Davidson .............. H01L 23/427 174/15.2
5,285,347 A 2/1994 Fox et al.
(Continued)

FOREIGN PATENT DOCUMENTS

CN 209486606 U 10/2019
CN 112885798 A 6/2021
(Continued)

OTHER PUBLICATIONS

Extended European Search Report for European Application No. 24151049.4; Report Mail Date May 28, 2024 (7 Pages).

*Primary Examiner* — Zachary Pape
(74) *Attorney, Agent, or Firm* — CANTOR COLBURN LLP

(57) ABSTRACT

A method of cooling an assembly including at least one heat-generating electronic device and at least one peripheral heat-generating device includes cooling the at least one heat-generating electronic device with a primary cooling fluid and cooling the at least one heat-generating electronic device and the at least one peripheral heat-generating device with a secondary cooling fluid. The secondary cooling fluid is distinct from the primary cooling fluid.

20 Claims, 13 Drawing Sheets

(56) References Cited

U.S. PATENT DOCUMENTS 6,970,355 B2* 11/2005 Ellsworth, Jr. .... H05K 7/20781 174/15.1
7,013,956 B2* 3/2006 Thayer ................ F28D 15/0266 174/15.1
7,017,657 B2* 3/2006 Sugito ................. F28D 15/0266 257/714
7,251,137 B2 7/2007 Iijima et al.
7,333,334 B2 2/2008 Yamatani et al.
7,365,973 B2 4/2008 Rasmussen et al.
7,406,839 B2 8/2008 Bean et al.
7,418,825 B1 9/2008 Bean, Jr.
7,527,085 B2 5/2009 Iijima et al.
7,551,440 B2 6/2009 Belady et al.
7,564,685 B2 7/2009 Clidaras et al.
7,819,175 B2 10/2010 Zoodsma
7,969,734 B2 6/2011 Arik et al.
8,014,150 B2 9/2011 Campbell et al.
8,031,468 B2 10/2011 Bean, Jr. et al.
8,091,614 B2 1/2012 Martin et al.
8,145,363 B2 3/2012 Bean, Jr. et al.
8,209,056 B2 6/2012 Rasmussen et al.
8,276,394 B2 10/2012 Heydari et al.
8,327,656 B2 12/2012 Tutunoglu et al.
8,369,090 B2 2/2013 Chester et al.
8,425,287 B2 4/2013 Wexler
8,448,876 B2 5/2013 Yang
8,596,079 B2 12/2013 Beam
8,613,229 B2 12/2013 Bean, Jr. et al.
8,644,020 B2 2/2014 Lau et al.
8,724,315 B2* 5/2014 Branton ............. H05K 7/20263 361/689
8,780,555 B2 7/2014 Fink et al.
8,934,242 B2 1/2015 Bean, Jr. et al.
9,003,821 B2 4/2015 Malone et al.
9,072,201 B2 6/2015 Bean, Jr.
9,288,931 B2* 3/2016 Inaba ................. H05K 7/20818
9,326,431 B2 4/2016 Matsushita et al.
9,549,488 B2 1/2017 Zeighami et al.
9,706,689 B2 7/2017 Levesque
9,921,622 B2 3/2018 Shelnutt et al.
10,334,763 B2 6/2019 Gao et al.
10,356,949 B2 7/2019 Pan et al.
10,548,239 B1 1/2020 Iyengar et al.
10,791,653 B2 9/2020 Ma
10,820,450 B2 10/2020 Lyon et al.
10,842,054 B2 11/2020 Chen et al.
10,856,447 B2 12/2020 Chen et al.
10,888,033 B2 1/2021 Luo et al.
10,952,353 B1 3/2021 Bean, Jr. et al.
10,962,297 B2 3/2021 Agonafer et al.
10,966,352 B2 3/2021 Iyengar et al.
11,044,835 B2 6/2021 Chiu et al.
11,058,028 B2 7/2021 Winkel et al.
11,109,517 B2 8/2021 Farshchian et al.
11,119,543 B2 9/2021 Thakar et al.
11,147,191 B2 10/2021 Chen et al.
11,249,522 B2 2/2022 Kulkarni et al.
11,268,739 B2 3/2022 Wang et al.
11,343,945 B2 5/2022 Dogruoz et al.
11,382,242 B2 7/2022 Plecko
11,412,638 B2 8/2022 Chen et al.
11,464,135 B2 10/2022 Reilly
11,497,145 B2 11/2022 Lee et al.
11,523,544 B2 12/2022 Madanipour et al.
11,533,830 B2 12/2022 Thibaut et al.
11,725,974 B2 8/2023 Bean, Jr. et al.
2005/0259397 A1 11/2005 Bash et al.
2007/0025078 A1* 2/2007 Silverstein .......... F28D 15/0266 361/709
2008/0314565 A1 12/2008 Martin et al.
2011/0056674 A1* 3/2011 Campbell ............ H05K 7/2079 165/104.31
2018/0027695 A1 1/2018 Wakino et al.
2021/0212237 A1 7/2021 Bean, Jr.
2021/0247822 A1 8/2021 Gao
2022/0087054 A1 3/2022 Heydari
2022/0100242 A1 3/2022 Saksager
2022/0183191 A1 6/2022 Vangilder et al.
2022/0208647 A1 6/2022 Gao
2022/0210955 A1 6/2022 Heydari
2023/0018736 A1* 1/2023 Tsai ................... H05K 7/20272
2023/0030457 A1 2/2023 Heydari
2023/0038890 A1 2/2023 Musilli, Jr. et al.

FOREIGN PATENT DOCUMENTS

CN 216437820 U 5/2022
CN 216437821 U 5/2022
EP 2720523 B1 1/2018
EP 3093936 B1 1/2018
EP 3324716 B1 1/2022
GB 2576032 A 4/2021
IN 202111049690 A 10/2021
TW 202249577 A 12/2022
TW 202249579 A 12/2022

* cited by examiner 22
30
30
20

SERVER BLADE TOP VIEW
PERIPHERALS/POWER SUPPLY
COOL C2
CPU
GPU
CPU
STORAGE & I/O PANEL
REF. OUTLET
REF. INLET
130
C1
C1
50,150
V4
V5
HOT C2
100
30
38
36
40

SERVER WITH HYBRID THERMAL MANAGEMENT SYSTEM

CROSS-REFERENCE TO RELATED APPLICATIONS

This application claims the benefit of U.S. Provisional Application Nos. 63/479,115, filed Jan. 9, 2023, and 63/586,527 filed Sep. 29, 2023, the contents of which are incorporated by reference herein in their entirety.

BACKGROUND

Exemplary embodiments pertain to the art of thermal management, and more particularly, relate to thermal management of a server within a data center.

A "data center" refers to the physical location of one or more servers. A data center and the servers housed within a data center typically consume a significant amount of electrical power. Existing servers are designed to be cooled at least partially by a flow of air. Such servers usually include one or more printed circuit boards having a plurality of operable heat-generating devices mounted thereto. The printed circuit boards are commonly housed in an enclosure having vents configured to direct external air from the data center into, through and out of the enclosure. The air absorbs heat dissipated by the components and after being exhausting from the enclosure, mixes with the ambient air. An air conditioner is then used to cool the heated air of the data center and to recirculate it, repeating the cooling process.

Higher performance server components typically dissipate more power. However, the amount of heat that conventional cooling system can remove from a server is in part limited by the extent of the air conditioning available from the data center. In general, a lower air temperature in a data center allows each server component cooled by an air flow to dissipate a higher power, and thus allows each server to operate at a correspondingly higher level of performance.

BRIEF DESCRIPTION

According to an embodiment, a method of cooling an assembly including at least one heat-generating electronic device and at least one peripheral heat-generating device includes cooling the at least one heat-generating electronic device with a primary cooling fluid and cooling the at least one heat-generating electronic device and the at least one peripheral heat-generating device with a secondary cooling fluid. The secondary cooling fluid is distinct from the primary cooling fluid.

In addition to one or more of the features described herein, or as an alternative, further embodiments may include cooling the at least one heat-generating electronic device with the primary cooling fluid further comprises passing a flow of the primary cooling fluid over the at least one heat-generating electronic device.

In addition to one or more of the features described herein, or as an alternative, further embodiments may include that cooling the at least one heat-generating electronic device with the primary cooling fluid further includes passing a flow of the primary cooling fluid across a heat sink attached to the at least one heat-generating electronic device.

In addition to one or more of the features described herein, or as an alternative, further embodiments may include transferring heat from the secondary cooling fluid to the primary cooling fluid.

In addition to one or more of the features described herein, or as an alternative, further embodiments may include that transferring heat from the secondary cooling fluid to the primary cooling fluid occurs prior to cooling the at least one heat-generating electronic device and the at least one peripheral heat-generating device with the secondary cooling fluid.

In addition to one or more of the features described herein, or as an alternative, further embodiments may include that transferring heat from the secondary cooling fluid to the primary cooling fluid further includes providing the primary cooling fluid and the secondary cooling fluid to a heat exchanger. The primary cooling fluid is provided to the at least one heat-generating electronic device and to the heat exchanger in parallel.

In addition to one or more of the features described herein, or as an alternative, further embodiments may include that providing the secondary cooling fluid to the heat exchanger further includes moving the secondary cooling fluid through the heat exchanger via a fan.

In addition to one or more of the features described herein, or as an alternative, further embodiments may include that providing the secondary cooling fluid to the heat exchanger further includes moving the secondary cooling fluid through the heat exchanger via a movement mechanism.

In addition to one or more of the features described herein, or as an alternative, further embodiments may include that cooling the at least one heat-generating electronic device with the primary cooling fluid further includes cooling a plurality of heat-generating electronic devices with the primary cooling fluid. The plurality of heat-generating electronic devices are cooled in series using the primary cooling fluid.

In addition to one or more of the features described herein, or as an alternative, further embodiments may include that cooling the at least one heat-generating electronic device with the primary cooling fluid further includes cooling a plurality of heat-generating electronic devices with the primary cooling fluid. The plurality of heat-generating electronic devices are cooled in parallel using the primary cooling fluid.

In addition to one or more of the features described herein, or as an alternative, further embodiments may include equalizing the flow of the primary cooling fluid used to cool each of the plurality of heat-generating electronic devices.

In addition to one or more of the features described herein, or as an alternative, further embodiments may include adjusting the flow of the primary cooling fluid provided to the plurality of heat-generating electronic devices based on a thermal demand of each of the plurality of heat-generating electronic devices.

According to an embodiment, a cooling system for cooling an assembly including at least one heat-generating electronic device and at least one peripheral heat-generating device includes a first flow path for a primary cooling fluid and at least one heat exchanger arranged along the first flow path and configured to receive the primary cooling fluid. At least one second flow path for the primary cooling fluid. At least a portion of the at least one second flow path for the primary cooling fluid is arranged in parallel with the first flow path for the primary cooling fluid. The at least one second flow path of the primary cooling fluid is thermally coupled to the at least one heat-generating electronic device. The cooling system additionally includes a flow path for a secondary cooling fluid and the at least one heat exchanger is disposed along the flow path of the secondary cooling fluid.

In addition to one or more of the features described herein, or as an alternative, further embodiments may include that the at least one heat-generating electronic device and the at least one peripheral heat-generating device are arranged along the flow path of the secondary cooling fluid.

In addition to one or more of the features described herein, or as an alternative, further embodiments may include that the at least one heat-generating electronic device and the at least one peripheral heat-generating device are arranged downstream from the heat exchanger along the flow path of the secondary cooling fluid.

In addition to one or more of the features described herein, or as an alternative, further embodiments may include that the at least one second flow path of the primary cooling fluid is fluidly connected to the first flow path at a location upstream from the heat exchanger.

In addition to one or more of the features described herein, or as an alternative, further embodiments may include that the at least one second flow path of the primary cooling fluid further comprises a plurality of second flow paths arranged in parallel.

In addition to one or more of the features described herein, or as an alternative, further embodiments may include that the secondary cooling fluid is moved along the flow path for the secondary cooling fluid via a fan.

In addition to one or more of the features described herein, or as an alternative, further embodiments may include that the secondary cooling fluid is moved along the flow path for the secondary cooling fluid via a movement mechanism.

According to an embodiment, a data center includes at least one server having a printed circuit board, at least one heat-generating electronic device electrically coupled to the printed circuit board and at least one peripheral heat-generating device electrically coupled to the printed circuit board. A cooling system is thermally coupled to the at least one server. The cooling system includes a primary cooling fluid having a flow path such that the primary cooling fluid is thermally coupled to the at least one heat-generating electronic device and a secondary cooling fluid having a flow path such that the secondary cooling fluid is thermally coupled to the at least one peripheral heat-generating device.

According to an embodiment, a method of cooling an assembly including at least one heat-generating electronic device and at least one peripheral heat-generating device includes cooling the at least one heat-generating electronic device with a primary cooling fluid, cooling a secondary cooling fluid with the primary cooling fluid at the least one heat-generating electronic device, and cooling the at least one peripheral heat-generating device with the secondary cooling fluid.

In addition to one or more of the features described herein, or as an alternative, further embodiments may include that cooling the secondary cooling fluid with the primary cooling fluid occurs before cooling the at least one peripheral heat-generating device with the secondary cooling fluid.

In addition to one or more of the features described herein, or as an alternative, further embodiments may include that cooling the at least one heat-generating electronic device with the primary cooling fluid further includes transferring heat from the at least one heat-generating electronic device to a heat spreader and transferring heat from the heat spreader to the primary cooling fluid arranged within an inlet manifold of a heat exchanger.

In addition to one or more of the features described herein, or as an alternative, further embodiments may include that transferring heat from the heat spreader to the primary cooling fluid arranged within the inlet manifold of the heat exchanger further includes vaporizing at least a portion of the primary cooling fluid arranged within the inlet manifold.

In addition to one or more of the features described herein, or as an alternative, further embodiments may include that cooling the secondary cooling fluid with the primary cooling fluid at the at least one heat-generating electronic device further includes providing the primary cooling fluid and the secondary cooling fluid to the heat exchanger. The heat exchanger is in overlapping arrangement with the at least one heat-generating electronic device.

In addition to one or more of the features described herein, or as an alternative, further embodiments may include that providing the secondary cooling fluid to the heat exchanger further includes moving the secondary cooling fluid through the heat exchanger via a fan.

In addition to one or more of the features described herein, or as an alternative, further embodiments may include that providing the secondary cooling fluid to the heat exchanger further includes moving the secondary cooling fluid through the heat exchanger via a movement mechanism.

In addition to one or more of the features described herein, or as an alternative, further embodiments may include actively controlling a flow of the primary cooling fluid provided to the heat exchanger based on a thermal load at the heat exchanger.

In addition to one or more of the features described herein, or as an alternative, further embodiments may include determining the thermal load using information collected by one or more sensors.

In addition to one or more of the features described herein, or as an alternative, further embodiments may include determining the thermal load using at least one of a temperature of the primary cooling fluid at an outlet of the heat exchanger and the temperature of the heat spreader.

According to an embodiment, a cooling system for cooling an assembly including at least one heat-generating electronic device and at least one peripheral heat-generating device, the cooling system includes a heat exchanger mounted in overlapping arrangement with the at least one heat-generating electronic device. The heat exchanger is thermally coupled to the at least one heat-generating electronic device. A primary cooling fluid and a secondary cooling fluid are arranged in a heat exchange relationship within the heat exchanger. An outlet of the heat exchanger configured to receive the secondary cooling fluid is fluidly coupled to the at least one peripheral heat-generating device.

In addition to one or more of the features described herein, or as an alternative, further embodiments may include a fan for moving the secondary cooling fluid through the heat exchanger.

In addition to one or more of the features described herein, or as an alternative, further embodiments may include a movement mechanism for moving the secondary cooling fluid through the heat exchanger.

In addition to one or more of the features described herein, or as an alternative, further embodiments may include that the secondary cooling fluid is at least partially liquid.

In addition to one or more of the features described herein, or as an alternative, further embodiments may include a heat spreader thermally coupled to the at least one heat-generating electronic device and to the heat exchanger.

In addition to one or more of the features described herein, or as an alternative, further embodiments may include that the heat exchanger further includes an inlet manifold positioned adjacent to the heat spreader.

In addition to one or more of the features described herein, or as an alternative, further embodiments may include that a surface of the inlet manifold has a microstructure, the microstructure being optimized to facilitate boiling of the primary cooling fluid within the inlet manifold.

In addition to one or more of the features described herein, or as an alternative, further embodiments may include at least one valve operable to actively control a flow of the primary cooling fluid provided to the heat exchanger based on a thermal load at the heat exchanger.

In addition to one or more of the features described herein, or as an alternative, further embodiments may include at least one sensor for monitoring the thermal load at the heat exchanger.

In addition to one or more of the features described herein, or as an alternative, further embodiments may include that the at least sensor is operable to monitor at least one of a temperature of the primary cooling fluid at another outlet of the heat exchanger and the temperature of the heat spreader.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method are presented herein by way of exemplification and not limitation with reference to the Figures.

Figure 1:
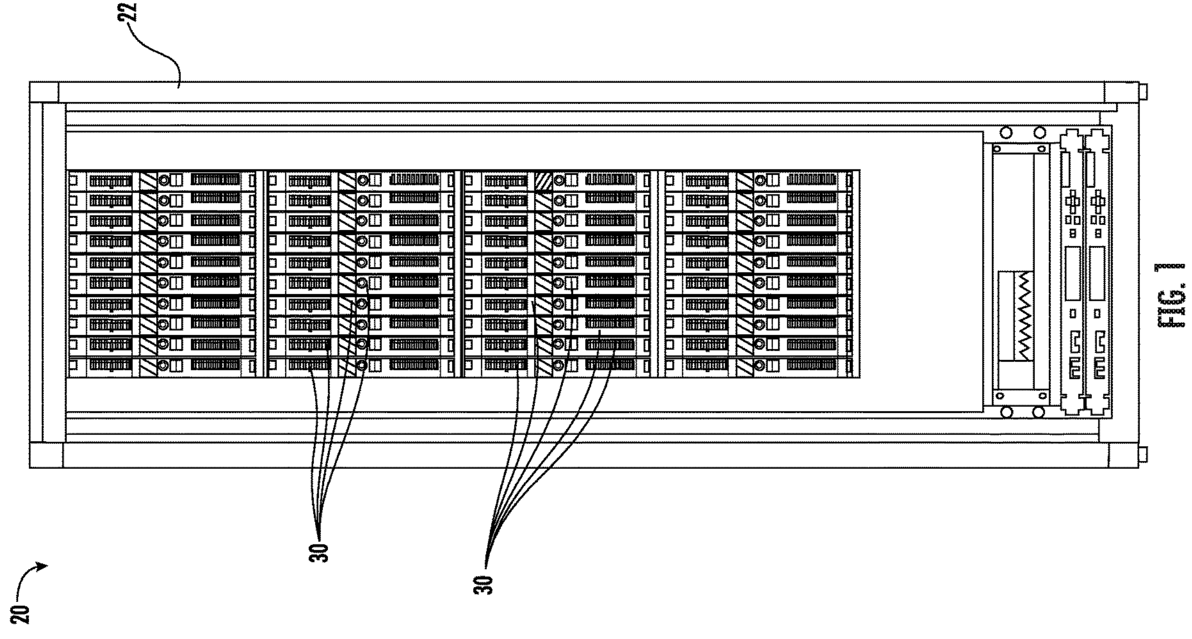
FIG. 1 is a front view of a data center rack having a plurality of servers mounted therein.

With reference now to FIG. 1, an example of a data center 20 is illustrated. As shown, the data center 20 includes a cabinet 22 having at least one, and in some embodiments, a plurality of slots (not shown) formed therein. One or more server rack sub-assemblies, also referred to herein as servers 30 may be permanently or removably mountable within the cabinet 22, such as within the one or more slots formed therein. The plurality of slots, and therefore the at least one server 30 receivable therein, may have a generally vertical orientation (shown), or alternatively, may have a horizontal orientation. In some embodiments, the data center 20 may include a combination of both horizontally oriented and vertically oriented slots. Further, although only a single cabinet 22 is illustrated in the FIG., it should be appreciated that the data center 20 may include several cabinets 22. In embodiments including a plurality of cabinets 22, the plurality of cabinets 22 may be arranged at the same location within a building, or alternatively, one or more of the cabinets 22 may be arranged at a different location within a single building or within multiple buildings.

Figure 2A:
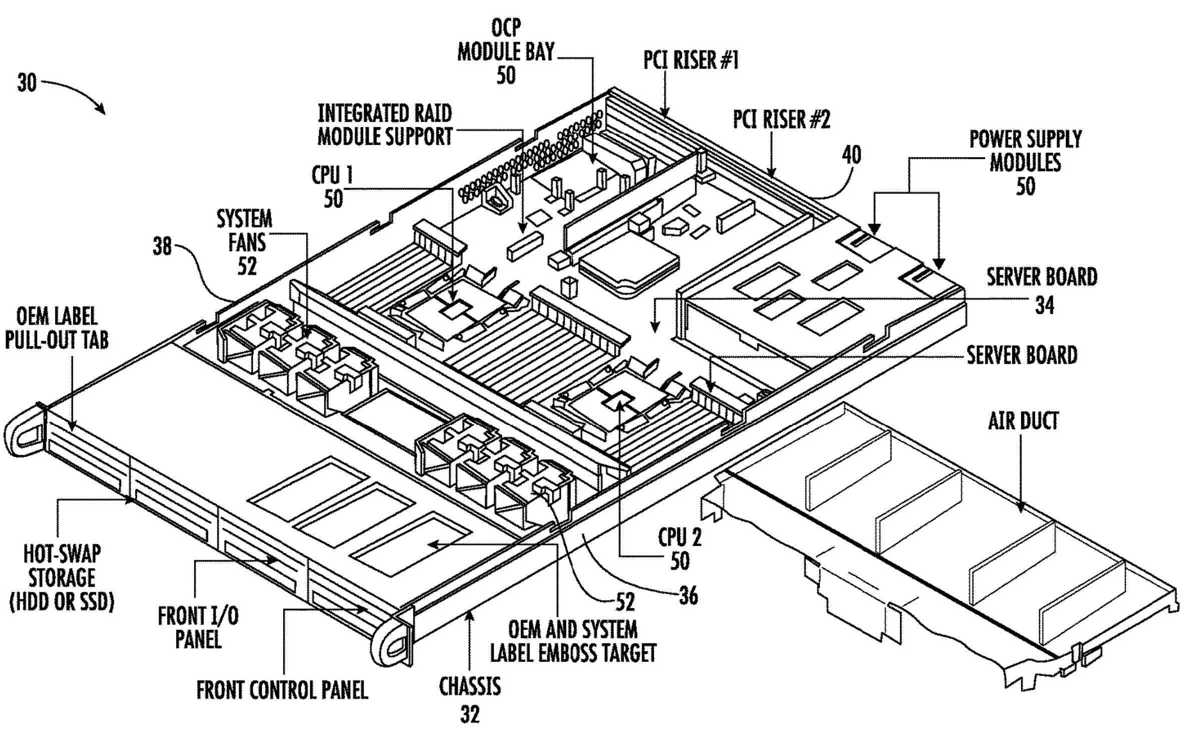
FIG. 2A is a perspective view of a server according to an embodiment.

With reference now to FIG. 2, an example of a server 30 receivable within a slot of the cabinet 22 is illustrated. As shown, the server 30 may include a frame or chassis 32 having at least one printed circuit board 34 mounted to the frame. Although only a single printed circuit board 34 is illustrated in the FIG., it should be understood that in some embodiments, a plurality of printed circuit boards may be mounted to the chassis 32. The chassis 32 is designed to be insertable, for example slidably insertable, into a slot of a server rack and allow for connection to power cables, data cables, and/or other connecting cables provided at or by the cabinet 22.

The chassis 32 may include a plurality of walls 36, 38, 40 oriented at an angle to the printed circuit board 34 and that extend about all or at least a portion of a periphery of the printed circuit board 34. In an embodiment, best shown in FIG. 2B, the chassis 32 includes at least one flat, generally planar panel connected to one or more of the peripheral walls 36,38, 40 of the chassis 32. The at least one flat panel 42 may be arranged at either a first side or a second side of the printed circuit board 34. When the server 30 is in a horizontal orientation as shown, such a flat panel 42 may be vertically offset from the printed circuit board 34, either above or underneath the printed circuit board. In some embodiments, a flat panel 42 may be arranged both above and below the printed circuit board. In an embodiment, the chassis 32 in combination with the flat panels 42 form an air-tight container surrounding the server 30. However, embodiments where a separate jacket or container is positioned about the server 30 to form an air-tight assembly are also contemplated herein.

At least one heat-generating electronic device 50 may be mounted or electrically connected to the printed circuit board 34. Examples of a heat-generating electronic device 50 include, but are not limited to a processor such as a central processing unit and/or graphics processing unit, memory, a hard drive, and a power supply module. A server 30 may also include one or more components that are not mounted to or are not electrically connected to the printed circuit board 34. In embodiments where the server 30 includes two or more of the same type of component, such as central processing units for example, the components may be aligned along an axis extending between the lateral sides 36, 38 of the chassis 32, may be aligned along an axis extending between the front and back of the chassis 32, or may be offset from one another in one or more directions. It should be appreciated that any heat-generating electronic device 50 may be located at any position within the chassis 32 or about the circuit board 34.

In an embodiment, one or more fluid movement devices 52, such as fans for example, are mounted to the printed circuit board 34 and are operable to move a flow of a fluid, such as air over the heat-generating electronic devices 50. In the illustrated, non-limiting embodiment, the at least one fluid movement device 52 is arranged near a first end 54 of the printed circuit board 34 such that when the server 30 is installed within the cabinet 22 the at least one fan 52 is positioned closer to the front of the cabinet 22 than the heat-generating electronic devices 50. However, embodiments where one or more fluid movement devices 52 are arranged at another suitable location, such as near a second end 56 of the printed circuit board 34 or of the chassis 32 associated with the rear of the cabinet 22 for example, are also within the scope of the disclosure. It should be appreciated that a server 30 having any suitable configuration, including servers having a full width or a half width or sled configuration are within the scope of the disclosure.

Figure 2B:
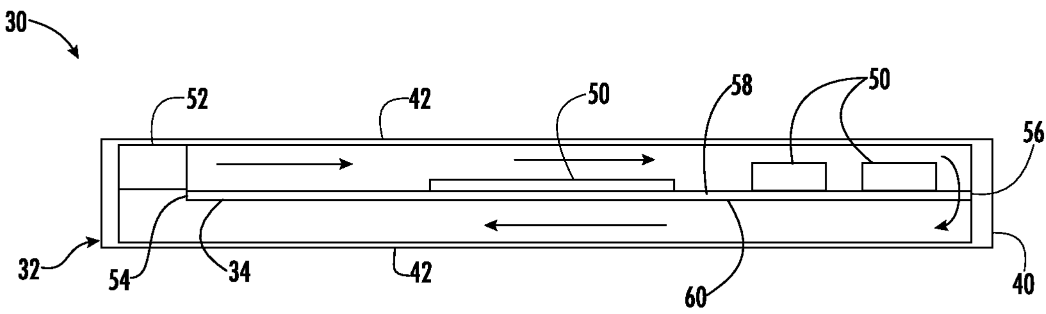
FIG. 2B is a cross-sectional side view of a server according to an embodiment.

In an embodiment, the fluid moved by the at least one fluid movement device 52 is configured to make a single pass over the heat-generating electronic devices. For example, cool air may be drawn into the fan 52 from a location adjacent to the front of the chassis 32 and after removing heat from the heat-generating electronic devices 50, may be exhausted at the back of the chassis 32. It should be appreciated that the air exhausted from the back of the cabinet may be the same temperature as the surrounding or environment, warmer than the surrounding environment, or even cooler than the surrounding environment. In other embodiments, such as where the chassis 32 includes at least one flat panel 42 for example, the fluid may be configured to continuously circulate within the server 30. For example, as best shown in FIG. 2B, a fan 52 may push the flow of fluid across the heat-generating electronic devices 50 arranged at a first surface 58 of the printed circuit board 34. Upon reaching the second end 56 of the printed circuit board 34, the fluid may turn through one or more openings and make a second pass along the second, opposite side 60 of the printed circuit board 34. Upon reaching the first end 54 of the printed circuit board 34, the fluid may turn again, and be drawn back into an inlet of the at least one fan 52.

With reference now to FIG. 3-6, various examples of a cooling system 100 for cooling one or more of the heat-generating electronic devices 50 of an assembly, such as of server 30 for example, are illustrated. In each of the illustrated, non-limiting embodiments of the cooling system 100, two forms of cooling are occurring. First, direct or primary cooling occurs at a specific heat-generating electronic device 50, such as a central processing unit for example. In an embodiment, heat is removed from the heat-generating electronic device 50 by a primary cooling fluid C1. The other heat-generating electronic devices 50 mounted to the printed circuit board 34 that are not directly cooled via the primary cooling fluid C1 may be considered "peripheral" heat-generating devices. Although in the illustrated, non-limiting embodiments, the heat-generating electronic device is described as a central processing unit or graphics processing unit and the peripheral heat-generating devices are described as other components, such as memory, hard drive, or power supply module, it should be appreciated that any of the components of the server 30 may be designed as the at least one heat-generating electronic device directly cooled by the primary cooling fluid C1, and any of the components of the server 30 may be designed as a peripheral heat-generating device.

The second form of cooling that is performed by the cooling system 100 is the cooling of at least one peripheral heat-generating device via a secondary cooling fluid C2. Further, the primary cooling fluid C1 may be used to condition the secondary cooling fluid C2 such that the secondary cooling fluid has a temperature suitable to remove heat from the one or more peripheral heat-generating devices. The primary and secondary cooling fluids C1, C2 described herein may be the same, or alternatively, may be distinct or different.

Figure 3:
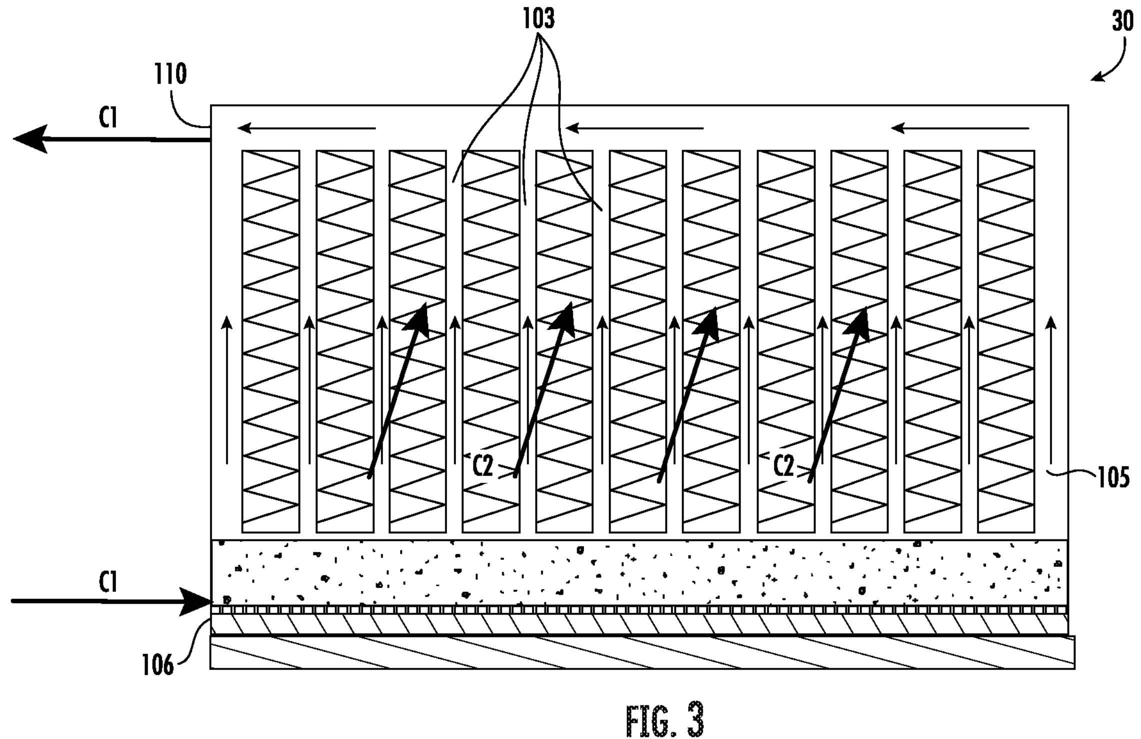
FIG. 3 is a cross-sectional view of a heat exchanger of a cooling system of a server according to an embodiment.

With continued reference to FIG. 3, the cooling system 100 may include at least one heat exchanger 102, such as mounted to at least one of the chassis 32 and the printed circuit board 34 for example. Although only a single heat exchanger 102 is illustrated in the FIGS., it should be appreciated that a plurality of heat exchanger may be included to increase the heat transfer that occurs therein. The at least one heat exchanger 102 may be located remotely from both the one or more selected heat-generating electronic devices 50 and the one or more peripheral heat-generating devices to be cooled by the cooling system 100. In the illustrated, non-limiting embodiment, the heat exchanger 102 is mounted near a first end 54 of the printed circuit board 34, at a location upstream from the at least one selected heat-generating electronic device 50 and downstream from the at least one fluid movement device 52. However, embodiments where the heat exchanger 102 is arranged at another location are also contemplated herein. For example, in other embodiments, the heat exchanger may be located downstream from one or more of the selected or peripheral heat generating electronic devices.

The heat exchanger 102 may be a microchannel heat exchanger having a plurality of substantially parallel microchannel heat exchanger tubes 103 (see FIG. 9), each defining a plurality of fluid flow paths (not shown) extending between an inlet header and an outlet header. However, examples of other types of heat exchangers that may be used, include, but are not limited to, microtube, double pipe, shell and tube, tube and fin, plate, plate and shell, adiabatic shell, plate fin, pillow plate, and fluid heat exchangers. The type of heat exchanger 102 selected may depend at least in part based on the type of primary and secondary cooling fluids being provided thereto.

The primary cooling fluid C1 and the secondary cooling fluid C2 are arranged in a heat exchange relationship at the heat exchanger 102. In an embodiment, the heat exchanger 102 is configured as an evaporator and the primary cooling fluid C1 provided to heat exchanger 102 is configured to absorb heat from the secondary cooling fluid C2. In the illustrated, non-limiting embodiments, the secondary cooling fluid C2 is a flow of air moved by the at least one fluid movement device 52 associated with the server 30. However, it should be understood that any fluid, including a liquid, may be used as the secondary cooling fluid. In the non-limiting embodiment illustrated, the heat exchanger 102 has a single pass configuration for both the primary cooling fluid C1 and the secondary cooling fluid C2. However, in other embodiments, at least one of the primary and secondary cooling fluids C1, C2 may make multiple passes through the heat exchanger 102. Further, the primary and secondary cooling fluids C1, C2 may be arranged in any suitable flow configuration at the heat exchanger, such as a cross-flow, a parallel flow, a counter-flow, or any combination thereof.

An inlet conduit 104 may be fluidly connected to a first fluid inlet 106 of the heat exchanger 102 and an outlet conduit 108 may be fluidly connected to a first fluid outlet 110 of the heat exchanger 102 to form a first flow path of the primary cooling fluid C1. The secondary cooling fluid C2 is provided to a second fluid inlet 105 of the heat exchanger 102 and is expelled from a second fluid outlet 107 of the heat exchanger 102.

In operation, the primary cooling fluid C1, such as a refrigerant for example, is provided to the inlet conduit 104. In an embodiment, the primary cooling fluid C1 provided to the inlet conduit 104 is a two-phase mixture of liquid and vapor; however, embodiments where the primary cooling fluid C1 is a single phase are also within the scope of the disclosure. From the inlet conduit 104, the primary cooling fluid C1 is provided to the first fluid inlet 106 of the heat exchanger 102. At the same time, a flow of secondary cooling fluid C2 is provided to the second fluid inlet 105 of the heat exchanger 102. Within the heat exchanger 102, the primary cooling fluid C1 is configured to remove heat from a secondary cooling fluid C2 1.

Figure 4:
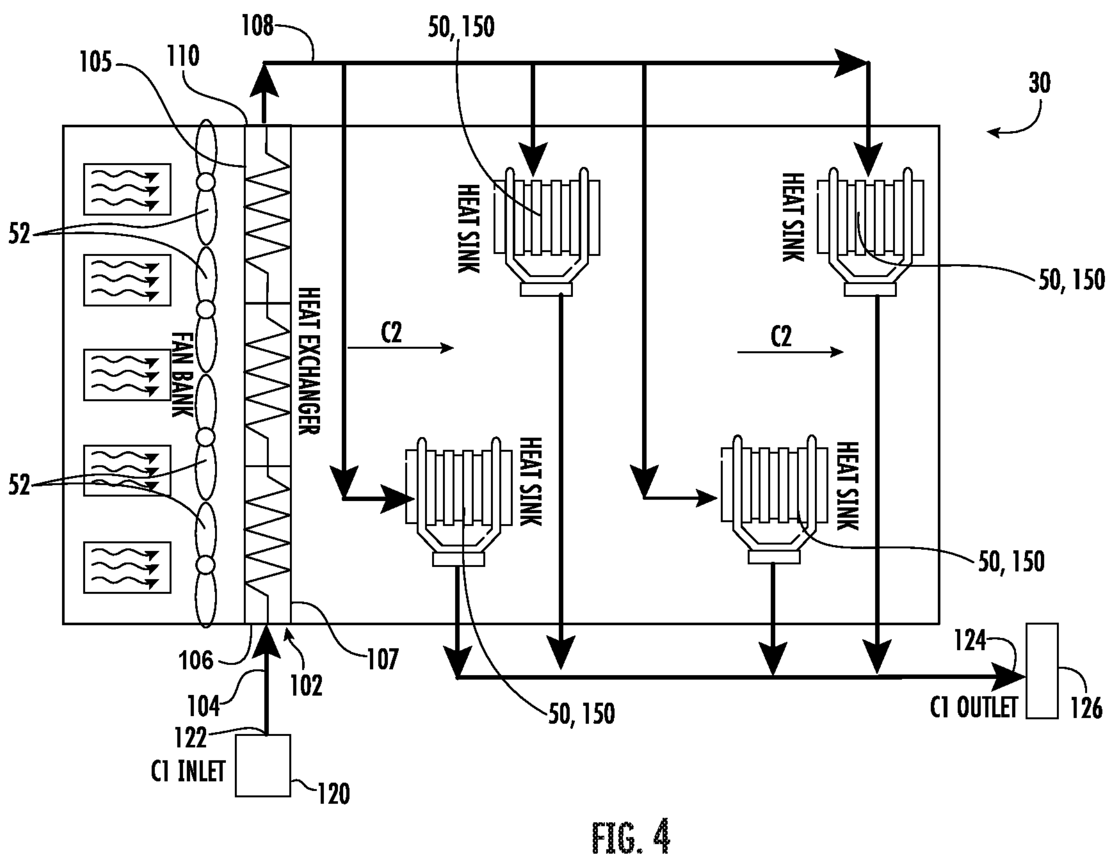
FIG. 4 is a schematic diagram of a cooling system of a server according to an embodiment.
Figure 5:
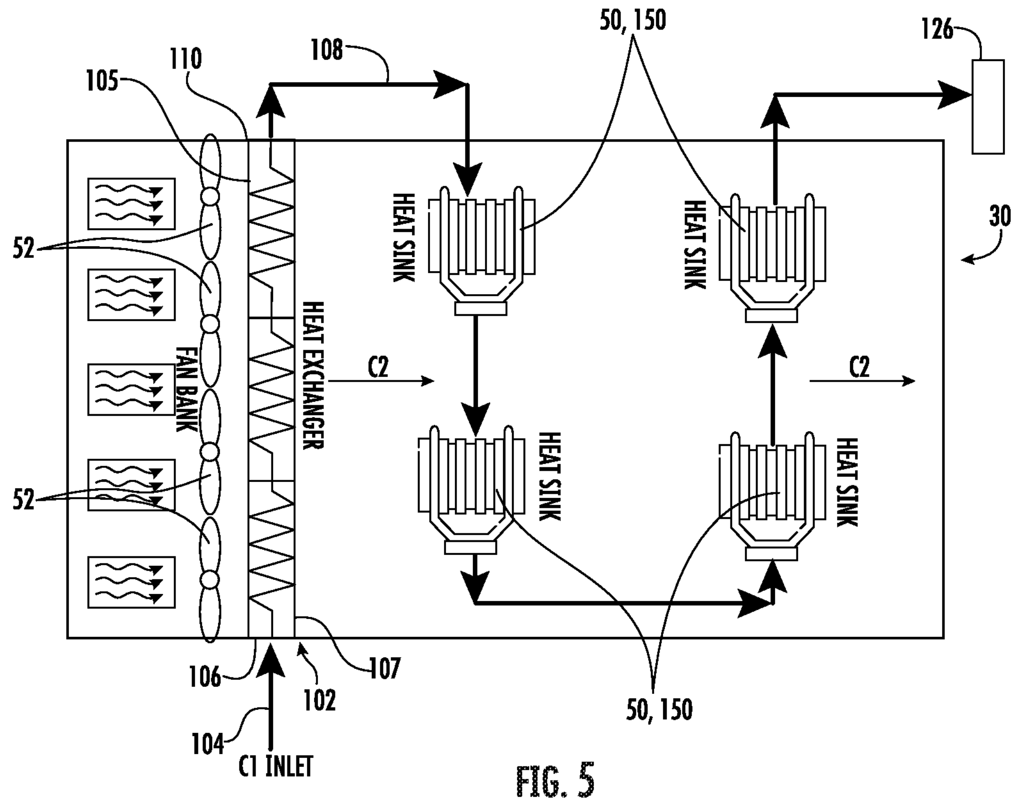
FIG. 5 is a schematic diagram of a cooling system of a server according to another embodiment.
Figure 6:
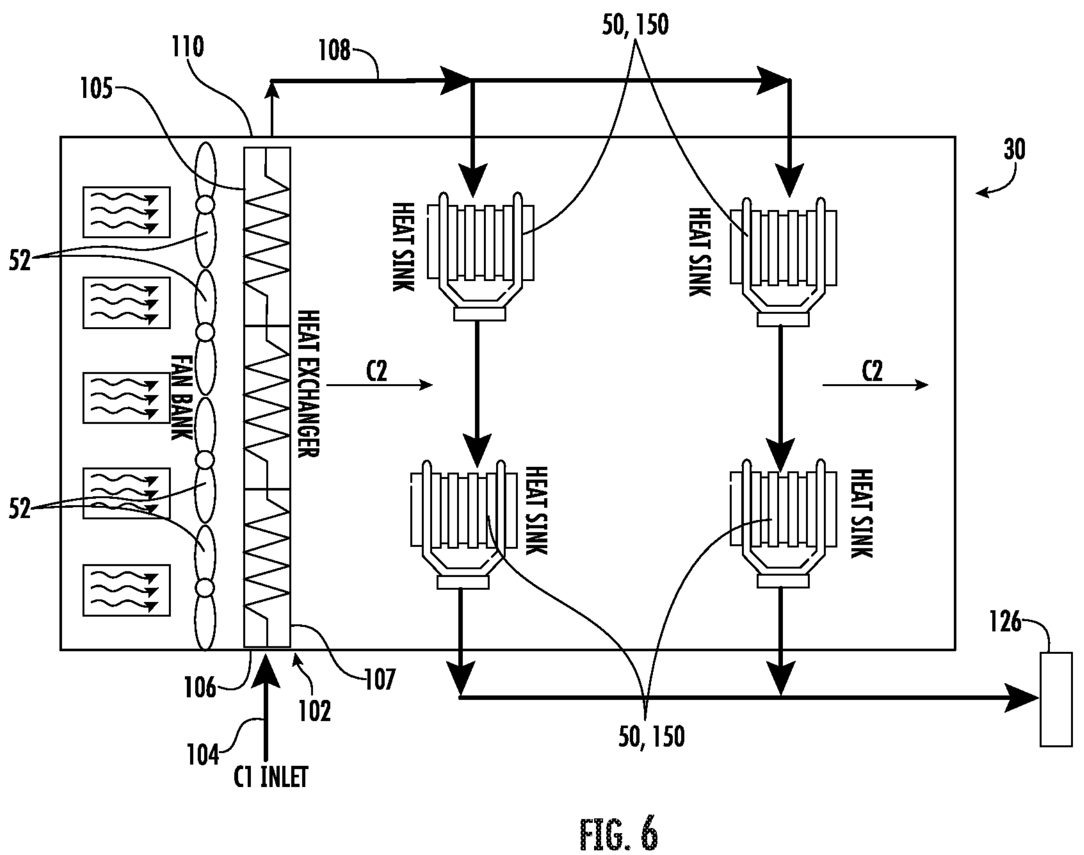
FIG. 6 is a schematic diagram of a cooling system of a server according to yet another embodiment.

The primary cooling fluid C1 output from the first fluid outlet 110 to the outlet conduit 108 may be returned directly to an outlet manifold 126. However, in some embodiments, such as shown in FIGS. 4-6, the primary cooling fluid C1 output from the first fluid outlet 110 is used to directly or indirectly cool or remove heat from one or more selected heat-generating electronic devices 50 of a server 30. As shown, in some embodiments, the cooling system 100 may include a heat removal device 150 thermally coupled to a respective selected heat-generating electronic device 50 and fluidly coupled to the first fluid outlet 110 via one or more conduits. It can be appreciated that in some embodiments, the cooling system 100 may include a plurality of heat removal devices 150, each positioned to directly cool one or more respective heat-generating electronic devices 50. In such embodiments, the primary cooling fluid C1 may flow to the plurality of heat removal devices 150 in any suitable manner.

For example, as shown in FIG. 4, each of the plurality of heat removal devices 150 may be fluidly connected in parallel relative to a flow of the primary cooling fluid C1 output from the first fluid outlet 110. In another embodiment, shown in FIG. 5, the plurality of heat removal devices 150 may be fluidly connected in series relative to a flow of the primary cooling fluid C1 output from the first fluid outlet 110. In yet another embodiment, the plurality of heat removal devices 150 may be fluidly connected in both parallel and series relative to a flow of the primary cooling fluid C1 downstream from the first fluid outlet 110. As shown, multiple flow paths extend between the first fluid outlet 110 and an outlet of the primary cooling fluid C1 relative to the server 30, and at least one of the flow paths, and in some embodiments each flow path, includes a plurality of heat removal devices 150.

The primary cooling fluid C1 output from the first fluid outlet 110 may be configured to flow across or through a heat removal device 150 corresponding to a selected heat-generating electronic device 50. At the heat removal device, heat is configured to transfer from the hot heat-generating electronic device 50 to the cooler primary cooling fluid C1. From the at least one heat removal device 150 the heated primary cooling fluid C1 may be output from the end of the outlet conduit 108 to an outlet manifold 126.

At the same time, the cool secondary cooling fluid C2 output from the second fluid outlet 107 of the heat exchanger 102 is configured to flow or move over the peripheral heat generating devices in a manner similar to that previously described. In an embodiment, the cool secondary cooling fluid C2 is also configured to flow over the heat removal device 150 of the at least one selected heat-generating electronic device 50. In such embodiments, at least one selected heat-generating electronic device 50 may be cooled at the same time by both the primary cooling fluid C1 and the secondary cooling fluid C2.

It should be appreciated that although the primary cooling fluid C1 is illustrated as flowing first through the heat exchanger 102 and then through one or more heat removal devices 150 in series, in other embodiments, the primary cooling fluid C1 may be configured to flow in an opposite direction. For example, the primary cooling fluid C1 may be provided to one or more heat removal devices 150 prior to passing through the heat exchanger 102.

Figure 7:
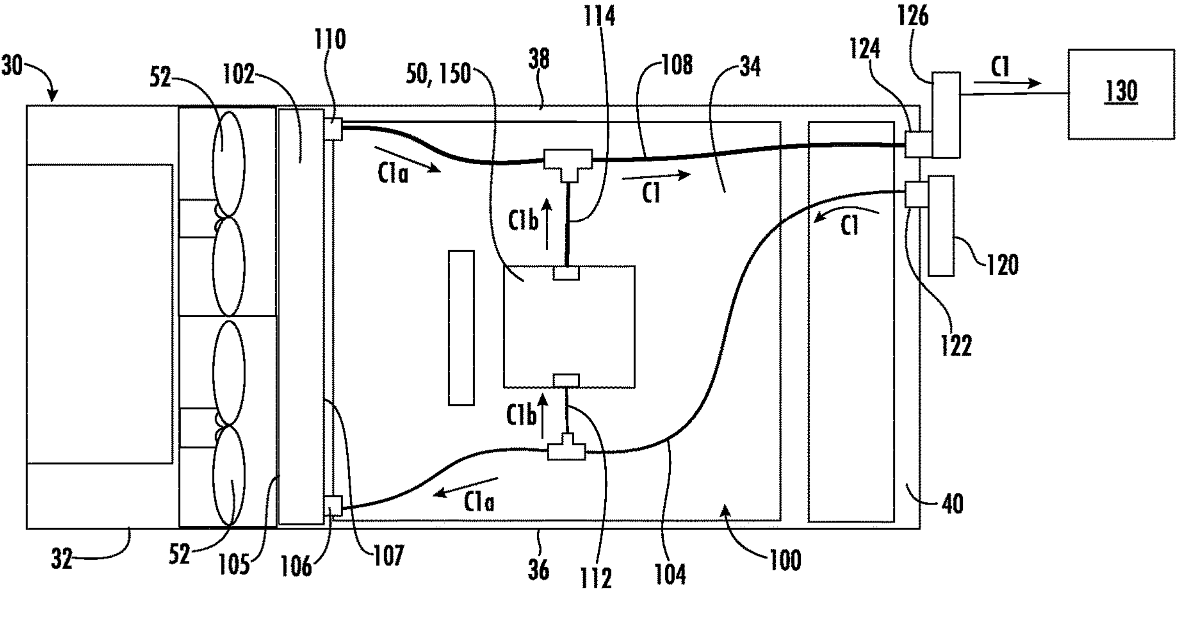
FIG. 7 is a schematic diagram of a cooling system of a server according to an embodiment.
Figure 8:
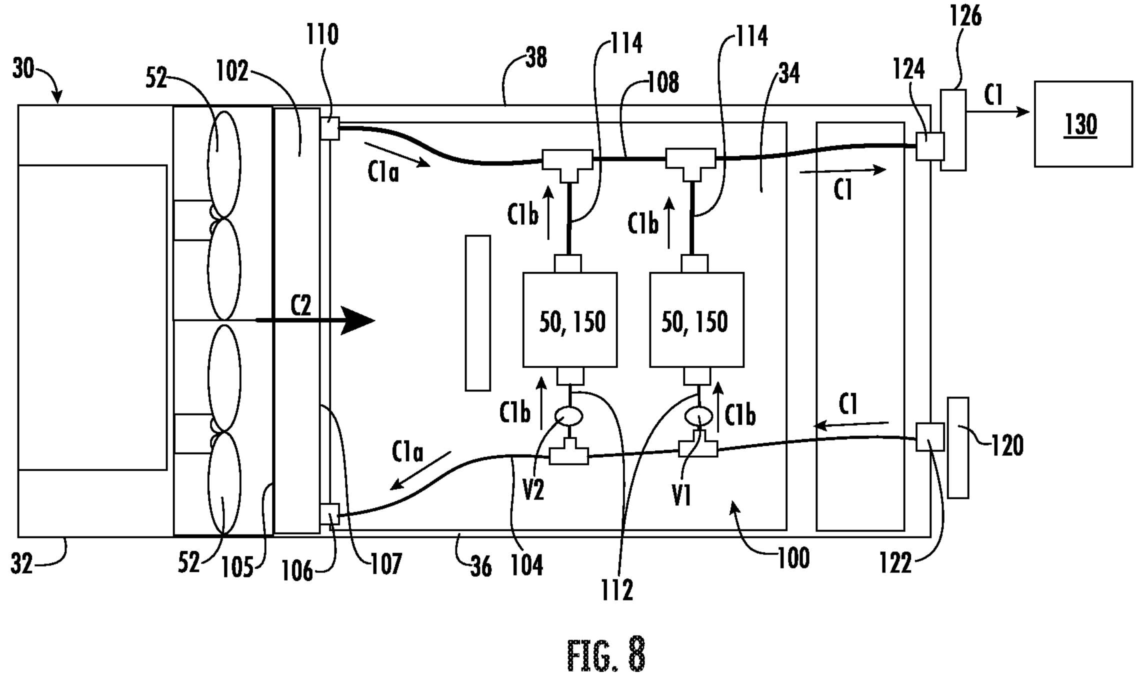
FIG. 8 is a schematic diagram of a cooling system of a server according to another embodiment.
Figure 9:
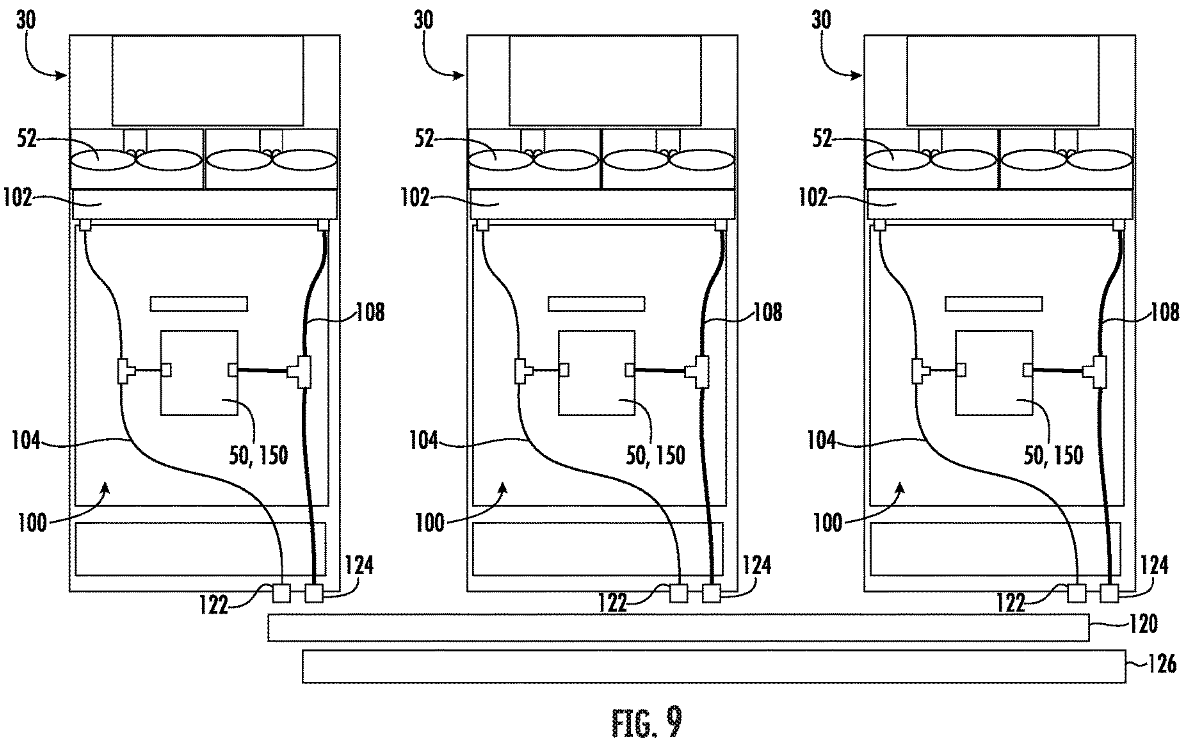
FIG. 9 is a schematic diagram of a plurality of servers, each server including a cooling system according to an embodiment.

As shown in FIGS. 7-9, at least one heat removal device 150 associated with at least one selected heat-generating electronic device 50 may alternatively, or additionally, be arranged in parallel with the heat exchanger 102 relative to the flow of the primary cooling fluid C1. As shown, at least one inlet branch 112 is fluidly connected to and extends from the inlet conduit 104 at a location of the upstream from the first fluid inlet 106. Similarly, at least one outlet branch 114 is fluidly connected to and extends from the outlet conduit 108 at a location downstream from the first fluid outlet 110. The inlet branch 112 and the outlet branch 114 may be fluidly coupled to the at least one selected heat-generating electronic device 50 and/or with a heat removal device 150 associated therewith. The inlet and outlet branches 112, 114 in combination form a second flow path of the primary cooling fluid C1. In an embodiment, the inlet conduit 104, outlet conduit 108, at least one inlet branch 112, and at least one outlet branch 114 are formed from a tube, hose, or other flexible material having a hollow interior through which the primary cooling fluid is configured to flow.

In the non-limiting embodiment of FIG. 7, the cooling system 100 includes a single inlet branch 112 and a single outlet branch 114 defining a single second flow path of the primary cooling fluid C1. In other embodiments, such as shown in FIG. 8, the at least one selected heat-generating electronic device 50 may include a plurality of heat-generating electronic devices 50. Accordingly, the cooling system 100 may be fluidly coupled to a plurality of heat-generating electronic devices 50 and a respective inlet branch 112 and outlet branch 114 are associated with each selected heat-generating electronic device 50 (such as via the respective heat removal devices 150). Accordingly, each inlet branch 112 and outlet branch 114 associated with a respective selected heat-generating electronic device 50 or its corresponding heat removal device 150 may define a second flow path of the primary cooling fluid C1. Further, although each inlet branch 112 and outlet branch 114 is illustrated as fluidly connecting to the inlet conduit 104 and the outlet conduit 108 separately, embodiments where the plurality of inlet branches 112 and/or the outlet branches 114 are connected to the inlet conduit 104 or outlet conduit 108 at the same location are also contemplated herein.

With continued reference to FIGS. 7-9, in operation, the primary cooling fluid C1, such as a refrigerant for example, is provided from an inlet manifold 120 to a first end 122 of the inlet conduit 104. In an embodiment, the primary cooling fluid C1 provided to the inlet conduit 104 is a two-phase mixture of liquid and vapor. As the primary cooling fluid C1 moves through the inlet conduit 104, the primary cooling fluid may be divided between the first flow path and the second flow path. A first portion C1*a* of the primary cooling fluid remains within the inlet conduit 104 and is provided to the first fluid inlet 106 of the heat exchanger 102. A second portion C1*b* of the primary cooling fluid is diverted to the at least one second flow path, such as to the one or more inlet branches 112. Accordingly, in an embodiment, the primary cooling fluid C1 is provided to the at least one selected heat-generating electronic device 50 and the heat exchanger 102 in parallel.

The second portion C1*b* of the primary cooling fluid provided to the at least one heat removal device 150 associated with the at least one selected heat-generating electronic device 50 is configured to remove heat from the at least one selected heat-generating electronic device 50. In an embodiment, the second portion C1*b* of the primary cooling fluid is configured to flow across or through the selected heat removal device 150. As a result of the additional heat absorbed from the at least one selected heat-generating electronic device 50 via the heat removal device 150, the second portion C1*b* of the primary cooling fluid provided to the outlet branch 114 has a greater amount of vapor than the second portion C1*b* of the primary cooling fluid provided to the inlet branch 112. In an embodiment, the second portion C1*b* of the primary cooling fluid provided to the outlet branch 114 is primarily vapor if not entirely vapor. Although FIG. 8 illustrates a plurality of selected heat-generating electronic device 50 and corresponding heat removal devices 150 arranged in parallel, it should be understood that embodiments that alternatively or additionally include a plurality of selected heat-generating electronic device 50 and corresponding heat removal devices 150 arranged in series are also within the scope of the disclosure.

In embodiments where the cooling system 100 is adapted to cool a plurality of selected heat-generating electronic devices 50 of a server 30, one or more valves may be operable to control the flow of the primary cooling fluid C1. For example, a valve (shown as V1 and V2 in FIG. 7) may be arranged within each inlet branch 112 to control the flow of primary cooling fluid C1 provided thereto. Although the valves V1 are illustrated as being arranged within the inlet branch 112, it should be understood that embodiments where the valve V1, V2 is arranged at another location, such as at the interface between the inlet branch 112 and the inlet conduit 104, and/or in the outlet branch 114 for example, are also within the scope of the disclosure.

Each valve V1 may be operable based on the heat required to be removed from each respective selected heat-generating electronic device 50. Accordingly, in an embodiment, the flows between the plurality of inlet branches 112 need not be equal. In other embodiments, to ensure that a flow is provided to each selected heat-generating electronic devices 50, the valves V1, V2 may be operable to balance the flow between the plurality of selected heat-generating electronic devices 50. In such embodiments, the flows between the plurality of inlet branches 112 may be equal.

As the second portion C1*b* of the primary cooling fluid removes heat from the at least one selected heat-generating electronic device 50, the first portion C1*a* of the primary cooling fluid simultaneously removes heat from the secondary cooling fluid C2 within the heat exchanger 102. As the heat transfers from the secondary cooling fluid C2 to the first portion C1*a* of the primary cooling fluid, at least a portion of the liquid within the first portion C1*a* of the primary cooling fluid vaporizes. The heated first portion C1*a* of the primary cooling fluid output from the first fluid outlet 110 of the heat exchanger 102 therefore has a greater amount of vapor than the first portion C1*a* of the primary cooling fluid provided to the first fluid inlet 106 of the heat exchanger 102. In an embodiment, the first portion C1*a* of the primary cooling fluid provided to the first fluid outlet 110 of the heat exchanger 102 is primarily vapor, if not entirely vapor.

The second portion C1*b* of the primary cooling fluid received in the at least one outlet branch 114 is then rejoined with the first portion C1*a* of the primary cooling fluid output from the first fluid outlet 110 of the heat exchanger 102 as a heated primary cooling fluid C1. This heated primary cooling fluid C1 may be delivered directly to one or more downstream loads 130 associated with the building containing the data center 20. However, in other embodiments, heated primary cooling fluid C1 is output from the end 124 of the outlet conduit 108 to an outlet manifold 126. In such embodiments, the primary cooling fluid C1 is directed from the outlet manifold 126 to the one or more downstream loads 130. The heat removed from the secondary cooling fluid C2 and the at least one selected heat-generating electronic device 50 by the primary cooling fluid C1 may be exhausted to another fluid, at the one or more loads 130. For example, in an embodiment, the downstream load is a hot water heater or an air conditioning system of the building.

The cool secondary cooling fluid C2 output from the heat exchanger 102 is configured to flow or move over the peripheral heat generating devices in a manner similar to that previously described. In the non-limiting embodiment of FIGS. 7-9, the cool secondary cooling fluid C2 is also configured to flow over the at least one selected heat-generating electronic device 50 and/or the heat removal device 150 associated therewith. In such embodiments, at least one selected heat-generating electronic device 50 may be cooled at the same time by both the primary cooling fluid C1 and the secondary cooling fluid C2.

Regardless of the flow configuration of the primary cooling fluid C1, the secondary cooling fluid C2 output from the server 30 may be greater than the temperature of the ambient atmosphere surrounding the server 30. In an embodiment, the cooling system 100 is capable of extracting all or substantially all of the heat output from the components of the server 30 such that the secondary cooling fluid C2 is output from the server 30 at the same temperature as the secondary cooling fluid C2 provided to the cooling system 100. In an embodiment, the temperature of the secondary cooling fluid C2 at the output from the server 30 is generally equal to the temperature of the ambient atmosphere surrounding the server 30 or the cabinet containing the server 30. In other embodiments, the temperature of the secondary cooling fluid C2 at the output from the server 30 is less than the temperature of the ambient atmosphere surrounding the server 30 or the cabinet containing the server 30. In such embodiments, the second cooling fluid C2 may function as a form of air conditioning used to cool the ambient atmosphere of the data center.

With reference to FIG. 9, a separate cooling system 100 may be applied to a plurality of servers 30. In such embodiments, the primary cooling fluid C1 may be provided to each of the plurality of cooling systems 100 in series or in parallel. In embodiments where the cooling systems 100 are arranged in parallel, an inlet manifold 120 may be fluidly coupled to the end 122 of each inlet conduit 104 and an outlet manifold 126 may be fluidly coupled to the end 124 of each outlet conduit 108. In such embodiments, the heated primary cooling fluid collected within the outlet manifold 126 from each of the cooling systems 100 is mixed and then delivered to the one or more downstream loads 130.

Figure 10:
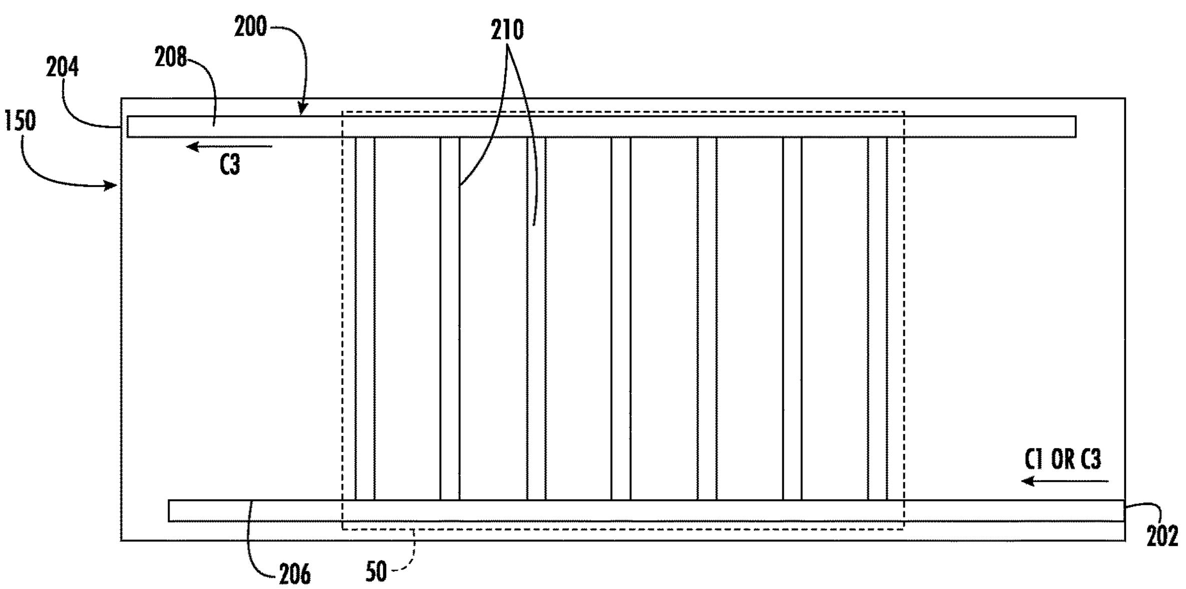
FIG. 10 is a cross-sectional view of a fluid circuit of a heat removal device according to an embodiment.

In an embodiment, the heat removal device 150 associated with each of the selected heat-generating electronic devices 50 is a cold plate having an internal fluid circuit. An example of an internal fluid circuit 200 of the heat spreader 140 is illustrated in the cross-sectional view of the heat spreader shown in FIG. 10. As shown, the fluid circuit 200 includes a fluid inlet 202 and a fluid outlet 204 formed in the body of the cold plate 150. The fluid inlet 202 and the fluid outlet 204 can be any shape, such as in the depth dimension (e.g., in the z-x plane of the attached figure), including the shape of a circle, oval, triangular, square, rectangular, or any simple polygonal shape or portion thereof. Also, in an embodiment, the fluid outlet 204 can have a much larger diameter compared to the fluid inlet 202, thereby helping to reduce the pressure drop for the cooling medium passing through the fluid outlet 204.

In an embodiment, the fluid circuit 200 includes a single continuous flow path extending between the fluid inlet 202 and the fluid outlet 204. However, in other embodiments, the fluid circuit 200 includes a first or inlet manifold 206, a second or outlet manifold 208, and at least one fluid passage 210 connecting the first and second manifolds 206, 208. In an embodiment, the at least one fluid passage 210 includes a plurality of fluid passages 210. In an embodiment, one or more fluid passages 210 of the fluid circuit 200 may be positioned to perform localized cooling at the area of the cold plate 150 with the greatest heat flux, such as at the area directly aligned with or in overlapping arrangement with a heat-generating electronic module. Accordingly, the at least one fluid passage 210 may be associated with a heat-generating electronic device 50.

Alternatively, or in addition, the heat removal device 150 includes a heat sink having a plurality of fins that extend generally upwardly and through which the secondary cooling fluid C2 is configured to pass. In yet another embodiment, the heat removal device 150 is a heat exchanger.

Although the heat removal device 150 is described herein as being arranged in series or parallel relative to heat exchanger 102 with respect to the flow of the primary cooling fluid C1, it should be appreciated that a cooling system 100 that does not have a heat exchanger 102 is also within the scope of the disclosure. Such a cooling system may simply have one or more heat removal devices 150.

Figure 11:
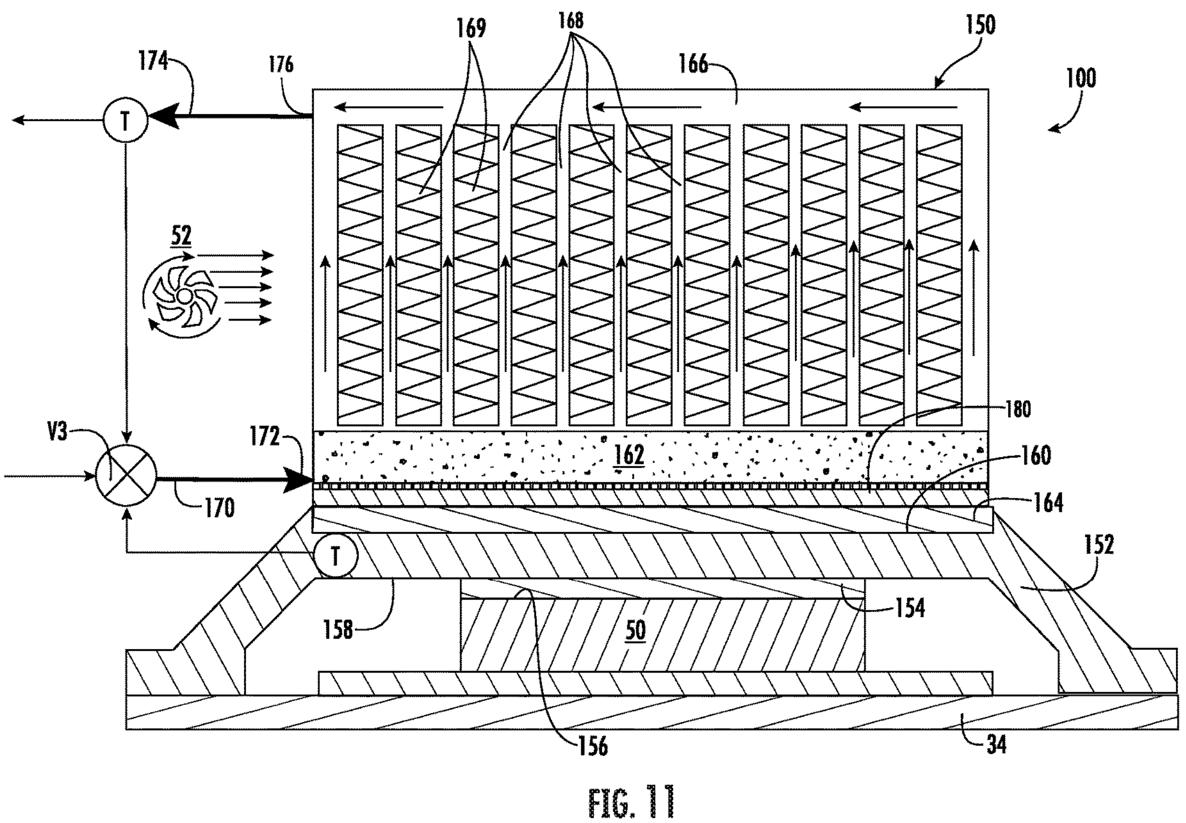
FIG. 11 is a cross-sectional view of a heat removal device of a cooling system of a server according to an embodiment.

With reference now to FIG. 11, an example of a heat removal device 150 of the cooling system 100 configured as a heat exchanger positionable at and thermally coupled to the at least one selected heat-generating electronic device 50 is illustrated. As shown, the heat exchanger 150 is mounted in an axially overlapping relationship with and is thermally coupled to the at least one selected heat-generating electronic device 50. In the illustrated, non-limiting embodiment, a heat spreader 152, such as formed from a conductive material, like sheet metal for example, is affixed to the printed circuit board 34 adjacent to the at least one selected heat-generating electronic device 50. Although the heat spreader 152 is illustrated as axially overlapping both the at least one selected heat-generating electronic device 50 and the printed circuit board 34, embodiments where the heat spreader 152 is arranged at another location relative to the at least one selected heat-generating electronic device 50 are also contemplated herein.

A thermal interface material 154 may be arranged between a surface 156 of the at least one selected heat-generating electronic device and an adjacent surface 158 of the heat spreader 152 to facilitate the transfer of heat from the at least one selected heat-generating electronic device 50 to the heat spreader 152. The surface area of the surface 158 of the heat spreader 152 facing the at least one selected heat-generating electronic device 50 may be greater than, equal to, or in some embodiments, may even be smaller than the surface area of the surface 156 of the at least one selected heat-generating electronic device 50.

The heat exchanger 150 is thermally coupled to a second, opposite surface 160 of the heat spreader 152. In an embodiment, the second, opposite surface 160 of the heat spreader 152 is greater than the surface 156 of the at least one selected heat-generating electronic device 50 to facilitate the transfer of heat from the heat spreader 152 to a fluid within the heat exchanger 150, such as the primary cooling fluid C1 for example. However, in other embodiments, the surface area of the second surface 160 of the heat spreader 152 may be the same or even smaller than the surface area of the at least one selected heat-generating electronic device 50.

In the illustrated, non-limiting embodiment, the body of the heat exchanger 150 includes an inlet manifold 162 positioned directly adjacent to the heat spreader 152 and may be thermally coupled thereto via a thermal interface material 164. Similarly, the body of the heat exchanger 150 may include an outlet manifold 166 fluidly connected to the inlet manifold 162 via the plurality of heat exchanger tubes 168. An inlet conduit 170 may be fluidly connected to a first fluid inlet 172 of the heat exchanger 150 and an outlet conduit 174 may be fluidly connected to a first fluid outlet 176 of the heat exchanger 150 as previously described.

In operation, the primary cooling fluid C1, such as a refrigerant for example, is provided from the inlet conduit 170 into the inlet manifold 162 of the heat exchanger 150. The primary cooling fluid C1 provided to the inlet manifold 162 may be a liquid, or alternatively, may be a two-phase mixture of liquid and vapor. Within the inlet manifold 162, at least a portion of the heat transferred to the first surface 158 of the heat spreader 152 from the at least one selected heat-generating electronic device 50 is transferred from the second surface 160 of the heat spreader 152 to the primary cooling fluid C1. The heat transferred to the primary cooling fluid C1 within the inlet manifold 162 causes the temperature of the primary cooling fluid C1 to increase, and in some embodiments, causes at least a portion of the primary cooling fluid C1 within the inlet manifold 162 to vaporize.

In an embodiment, a surface 180 of the heat exchanger 150, such as a bottom surface of the inlet manifold 162 for example, is optimized to facilitate boiling of the primary cooling fluid C1 within the inlet manifold 162. This optimization may include the formation of a specific microstructure at the surface 180. In an embodiment, this optimization is performed via application a coating or film applied to the surface 180. Alternatively, this optimization may be performed via a machining process or another suitable manufacturing process.

As the primary cooling fluid C1 vaporizes, the gaseous primary cooling fluid having some liquid primary cooling fluid entrained therein flows through the plurality of heat exchange tubes 168 of the heat exchanger 150 toward the outlet manifold 166 of the heat exchanger 150. In the illustrated, non-limiting embodiment, the secondary cooling fluid C2 is configured to flow through the gaps 169 defined between adjacent heat exchanger tubes 168. Within the plurality of passages of the heat exchange tubes 168, heat from the secondary cooling fluid C2 is transferred to the primary cooling fluid C1, causing at least some of the liquid primary cooling fluid C1 to vaporize. The resulting cooled secondary cooling fluid C2 output from the heat exchanger 150 may be configured to flow over the peripheral heat-generating devices of the server 30.

The heated primary cooling fluid C1 received within the outlet manifold 166 and output from the first fluid outlet 176 of the heat exchanger 150 may include a greater amount of vapor than the primary cooling fluid C1 provided to the first fluid inlet 172 of the heat exchanger 150. In an embodiment, the primary cooling fluid C1 provided to the first fluid outlet 176 of the heat exchanger 150 is primarily vapor, if not entirely vapor. As previously described, the heated primary cooling fluid C1 may be delivered to one or more downstream loads 130 associated with the building containing the server rack.

In embodiments where the heat removal device 150 is a heat exchanger 150, a fluid circuit such as fluid circuit 200 may be formed in the heat spreader 152. In such embodiments, the fluid inlet 202 of the fluid circuit 200 may be configured to connect a source of a third cooling medium C3 to the inlet manifold 206 using any suitable mechanical connection. The third cooling medium C3 may be the same as either the primary cooling fluid C1 or the secondary cooling fluid C2 or may be distinct or different therefrom.

The heat exchanger 150 is illustrated and described herein as a heat removal device 150 fluidly coupled to the heat exchanger 102, such as an outlet of the heat exchanger 102 for example, relative to the flow of the primary cooling fluid C1. As previously noted, it should be appreciated that in some embodiments the cooling system 100 does not include the heat exchanger 102. In such embodiments, the one or more heat removal devices 150 are relied upon to locally cool at least one selected heat-generating electronic device 50 and to cool the secondary cooling fluid C2.

As best shown in FIG. 11, at least one valve, indicated at V3, may be arranged within the inlet conduit 170 and/or the outlet conduit 174 to control the flow of the primary cooling fluid C1 to and from the heat exchanger 150. In an embodiment, the position of the valve V3 and therefore the flow through the heat exchanger 150, is actively managed based on a thermal load at the heat exchanger 150. The thermal load may be determined on information collected by one or more sensors, represented schematically at T. In the illustrated, non-limiting embodiment, a first sensor is operable to monitor the temperature of the heat spreader 152, and a second sensor is operable to monitor the temperature of the primary cooling fluid C1 at the outlet conduit 174. The at least one sensor T may be operable to measure temperature directly or may be configured to monitor another parameter that correlates to or can be used to derive temperature therefrom.

Figure 12:
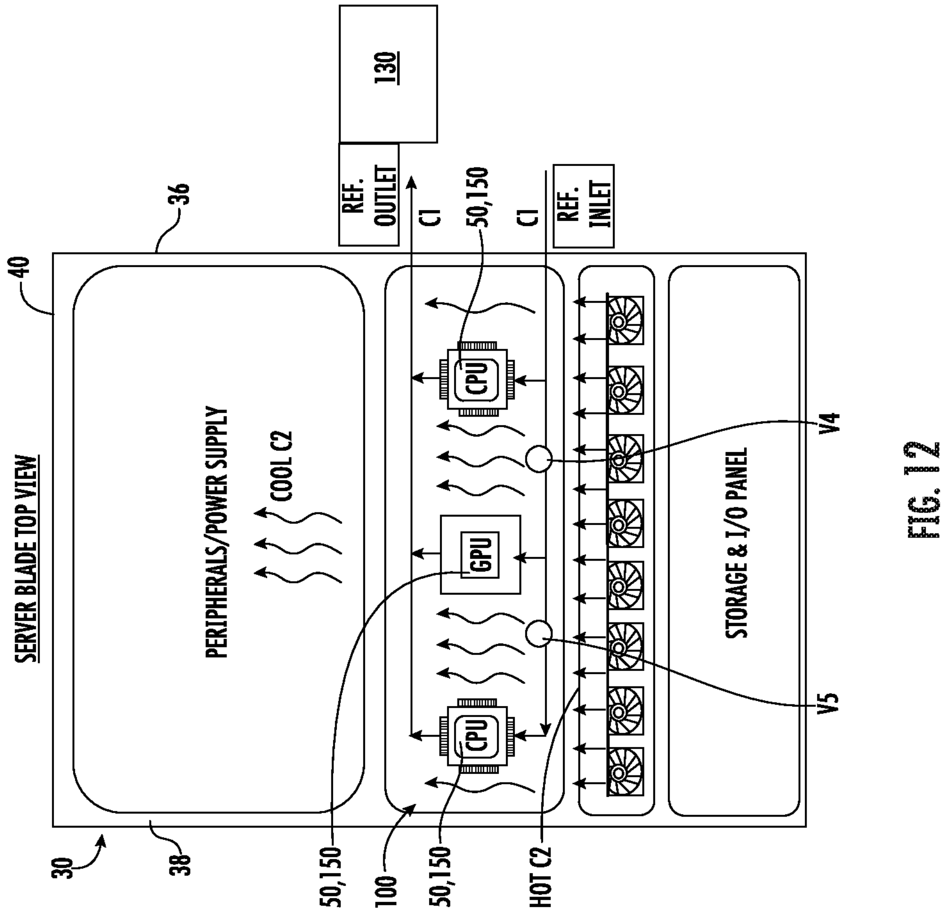
FIG. 12 is a plan view of a server including at least one cooling system according to an embodiment.

In the illustrated, non-limiting embodiment of FIG. 12, the cooling system 100 includes a heat removal device 150 associated with each of the three illustrated selected heat-generating electronic devices 50. In such embodiments, the primary cooling fluid C1 may be configured to flow through each of the plurality of heat removal devices 150 in parallel, as shown, or may be configured to flow through at least some of the plurality of heat removal devices 150 in series. In embodiments where the primary cooling fluid C1 is provided to the plurality of heat exchangers 150 in parallel, one or more valves, illustrated as V4 and V5, may be arranged within the fluid flow path upstream from the first fluid inlet 172 of each heat removal devices 150. Similar to the valves described above with respect to FIGS. 6-8, such valves V4, V5 may be operable to either equalize the flow between the plurality of heat removal devices 150 or distribute the flow based on the thermal demand at each heat removal devices 150. Alternatively, a single heat removal device 150 may be thermally coupled to each of the plurality of selected heat-generating electronic devices 50.

Although the secondary cooling fluid C2 provided to the cooling system 100 is air in the illustrated, and described non-limiting embodiments, it should be appreciated that in other embodiments another secondary cooling fluid C2 may be used. For example, the secondary cooling fluid C2 may be a liquid or a two-phase fluid. In such embodiments, the server 30 may be encased within a hermetically sealed jacket or container. Further, it should be appreciated that in embodiments where a liquid is used as the secondary cooling fluid, use of a heat exchanger having another configuration may be required. In addition, the server 30 may, but need not include the at least one fan previously described herein. Rather, another movement mechanism, such as a pump or some other component may be used to circulate the secondary cooling fluid through the heat exchanger and across the peripheral heat-generating devices.

Operation of a cooling system 100 as illustrated and described in any of the embodiments herein may be integrated into or associated with another system of the building, such as a building management system for example, or with a system associated with the data center, for example a refrigeration system, including but not limited to a heat pump and chiller.

A cooling system 100 as illustrated and described herein provides an easily scalable solution for cooling heat-generating components. Such a cooling solution can improve the sustainability and efficiency of the heat-generating components by rejecting the heat absorbed from the heat-generating component to a downstream heating application. In addition, the air conditioning load for cooling an area containing a data center is reduced. The cooling system 100 may have a reduced cost compared to existing single phase liquid cooling systems.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A method of cooling an assembly including at least one heat-generating electronic device and at least one peripheral heat-generating device, the method comprising:

cooling a secondary cooling fluid with a primary cooling fluid at a heat exchanger, the heat exchanger being arranged upstream from the at least one heat-generating electronic device and at least one peripheral heat-generating device relative to a primary cooling fluid and a secondary cooling fluid;

cooling the at least one heat-generating electronic device with the primary cooling fluid via a heat removal device thermally coupled to the at least one heat-generating electronic device;

cooling the secondary cooling fluid with the primary cooling fluid at the heat removal device; and cooling the at least one peripheral heat-generating device with the secondary cooling fluid at a location downstream from the heat removal device.

2. The method of claim 1, wherein cooling the secondary cooling fluid with the primary cooling fluid occurs before cooling the at least one peripheral heat-generating device with the secondary cooling fluid.

3. The method of claim 2, wherein cooling the secondary cooling fluid with the primary cooling fluid at the at least one heat-generating electronic device further comprises providing the primary cooling fluid and the secondary cooling fluid to the another heat exchanger, the another heat exchanger being in overlapping arrangement with the at least one heat-generating electronic device.

4. The method of claim 2, wherein providing the secondary cooling fluid to the another heat exchanger further comprises moving the secondary cooling fluid through the another heat exchanger via a fan.

5. The method of claim 2, wherein providing the secondary cooling fluid to the another heat exchanger further comprises moving the secondary cooling fluid through the another heat exchanger via a movement mechanism.

6. The method of claim 2, further comprising actively controlling a flow of the primary cooling fluid provided to the another heat exchanger based on a thermal load at the another heat exchanger.

7. The method of claim 6, wherein the thermal load is determined using information collected by one or more sensors.

8. The method of claim 6, wherein the thermal load is determined using at least one of a temperature of the primary cooling fluid at an outlet of the another heat exchanger and the temperature of the heat spreader.

9. The method of claim 1, wherein the heat removal device is another heat exchanger and cooling the at least one heat-generating electronic device with the primary cooling fluid further comprises:

transferring heat from the at least one heat-generating electronic device to a heat spreader; and transferring heat from the heat spreader to the primary cooling fluid arranged within an inlet manifold of the another heat exchanger.

10. The method of claim 9, wherein transferring heat from the heat spreader to the primary cooling fluid arranged within the inlet manifold of the another heat exchanger further comprises vaporizing at least a portion of the primary cooling fluid arranged within the inlet manifold.

11. A cooling system for cooling an assembly including at least one heat-generating electronic device and at least one peripheral heat-generating device, the cooling system comprising:

a heat exchanger arranged upstream from the at least one heat-generating electronic device and at least one peripheral heat-generating device;

another heat exchanger mounted in overlapping arrangement with the at least one heat-generating electronic device, the another heat exchanger being thermally coupled to the at least one heat-generating electronic device;

wherein a primary cooling fluid and a secondary cooling fluid are arranged in a heat exchange relationship at both the heat exchanger and the another heat exchanger, the secondary cooling fluid being cooled by the primary cooling fluid at both the heat exchanger and the another heat exchanger, wherein the another heat exchanger is arranged downstream from the heat exchanger relative to the primary cooling fluid and the at least one peripheral heat-generating device is arranged downstream from an outlet of the another heat exchanger relative to a flow of the second cooling fluid.

12. The cooling system of claim 11, further comprising a fan for moving the secondary cooling fluid through at least one of the heat exchanger and the another heat exchanger.

13. The cooling system of claim 11, further comprising a movement mechanism for moving the secondary cooling fluid through at least one of the heat exchanger and the another heat exchanger.

14. The cooling system of claim 11, wherein the secondary cooling fluid is at least partially liquid.

15. The cooling system of claim 11, further comprising a heat spreader thermally coupled to the at least one heat-generating electronic device and to the another heat exchanger.

16. The cooling system of claim 11, wherein the another heat exchanger further comprises an inlet manifold, the inlet manifold being positioned adjacent to the heat spreader.

17. The cooling system of claim 16, wherein a surface of the inlet manifold has a microstructure, the microstructure being optimized to facilitate boiling of the primary cooling fluid within the inlet manifold.

18. The cooling system of claim 15, further comprising at least one valve operable to actively control a flow of the primary cooling fluid provided to the another heat exchanger based on a thermal load at the another heat exchanger.

19. The cooling system of claim 18, further comprising at least one sensor for monitoring the thermal load at the another heat exchanger.

20. The cooling system of claim 19, wherein the at least sensor is operable to monitor at least one of a temperature of the primary cooling fluid at an outlet of the another heat exchanger and the temperature of the heat spreader.

* * * * *